United States Patent [19]
Zinsmeyer et al.

[11] 3,993,569
[45] *Nov. 23, 1976

[54] PHOTOELECTRICALLY TRIGGERED TIMING CIRCUIT FOR CONTROLLING ELECTRICALLY RESPONSIVE LOAD APPARATUS IN RESPONSE TO ALTERNATE LIGHT CHANGES

[75] Inventors: Herbert G. Zinsmeyer; David A. Biedermann; Francis D. Orr, all of Austin, Tex.

[73] Assignee: Lois M. Zinsmeyer, Austin, Tex.

[ * ] Notice: The portion of the term of this patent subsequent to July 23, 1991, has been disclaimed.

[22] Filed: Sept. 23, 1971

[21] Appl. No.: 183,093

[52] U.S. Cl. .......................... 250/209; 250/214 R; 317/127
[51] Int. Cl.² ................. H01J 39/12; H01H 47/24
[58] Field of Search ............... 250/214 R, 209; 317/127; 315/159

[56] References Cited
UNITED STATES PATENTS

| | | | |
|---|---|---|---|
| 3,421,008 | 1/1969 | Shaw | 250/214 |
| 3,476,943 | 11/1969 | Bruce | 250/214 X |
| 3,502,883 | 3/1970 | Archer | 250/209 X |

*Primary Examiner*—Alfred E. Smith
*Assistant Examiner*—T. N. Grigsby

[57] ABSTRACT

A combination timer and photoelectrically activated control circuit to selectively repeat a timed electromechanical operation at dawn and/or dusk in response to sunrise and/or sunset conditions. Said photoelectric control timer being provided with a deactivating circuit which turns off the output to the load after a preselected time. The circuit remains off even though the initiating light conditions prevail, or reverse. For example, if set to operate with illumination, the device operates in the morning at about sunrise, and after the preset interval a deactivating circuit switches off the output which remains off the remainder of the day while daylight prevails. When daylight ebbs, the photoelectric initiating circuit resets and the entire circuit is reset to repeat the operation when light returns the following morning. An equivalent photoelectric initiating circuit is provided to trigger the timer when light conditions change from light to darkness, such as at sundown.

15 Claims, 3 Drawing Figures

PHOTOELECTRICALLY TRIGGERED TIMING CIRCUIT FOR CONTROLLING ELECTRICALLY RESPONSIVE LOAD APPARATUS IN RESPONSE TO ALTERNATE LIGHT CHANGES

SUBJECT MATTER OF THE INVENTION

This invention relates to electric timers and more particularly to such timers in which the operating cycle is initiated in response to a pre-selected level of illumination.

OBJECTS OF THE INVENTION

A primary object of my invention is to provide a photoelectric timing control circuit which will supply current to electric equipment for a predetermined length of time in response to a preselected level of illumination such, for instance, as might obtain at sunrise.

Another object of my invention is to provide apparatus as described above which may be set to operate at sunrise, or sunset, or both.

A further object of my invention is to provide apparatus as described above in which the length of time current is supplied to the load may be varied.

A still further object of my invention is to provide apparatus as described above which is particularly adapted to operate electric equipment located in remote places.

A still further object of my invention is to provide apparatus as described above which is both compact and durable and which requires very little standby current.

These and other objects and advantages of this invention will become apparent through consideration of the following description and appended claims in conjunction with the attached drawings in which:

In describing one selected form or preferred embodiment of this invention as shown in the drawings and described in this specification, specific terms and components are used for clarity. However, it is not intended to limit the claimed invention to the specific form, components or construction shown and it is to be understood that the specific terms used in this illustration of the invention are intended to include all technical equivalents which operate in a similar manner to accomplish a similar purpose.

DETAILED DESCRIPTION OF PREFERRED EMBODIMENT OF INVENTION

Figure 1:
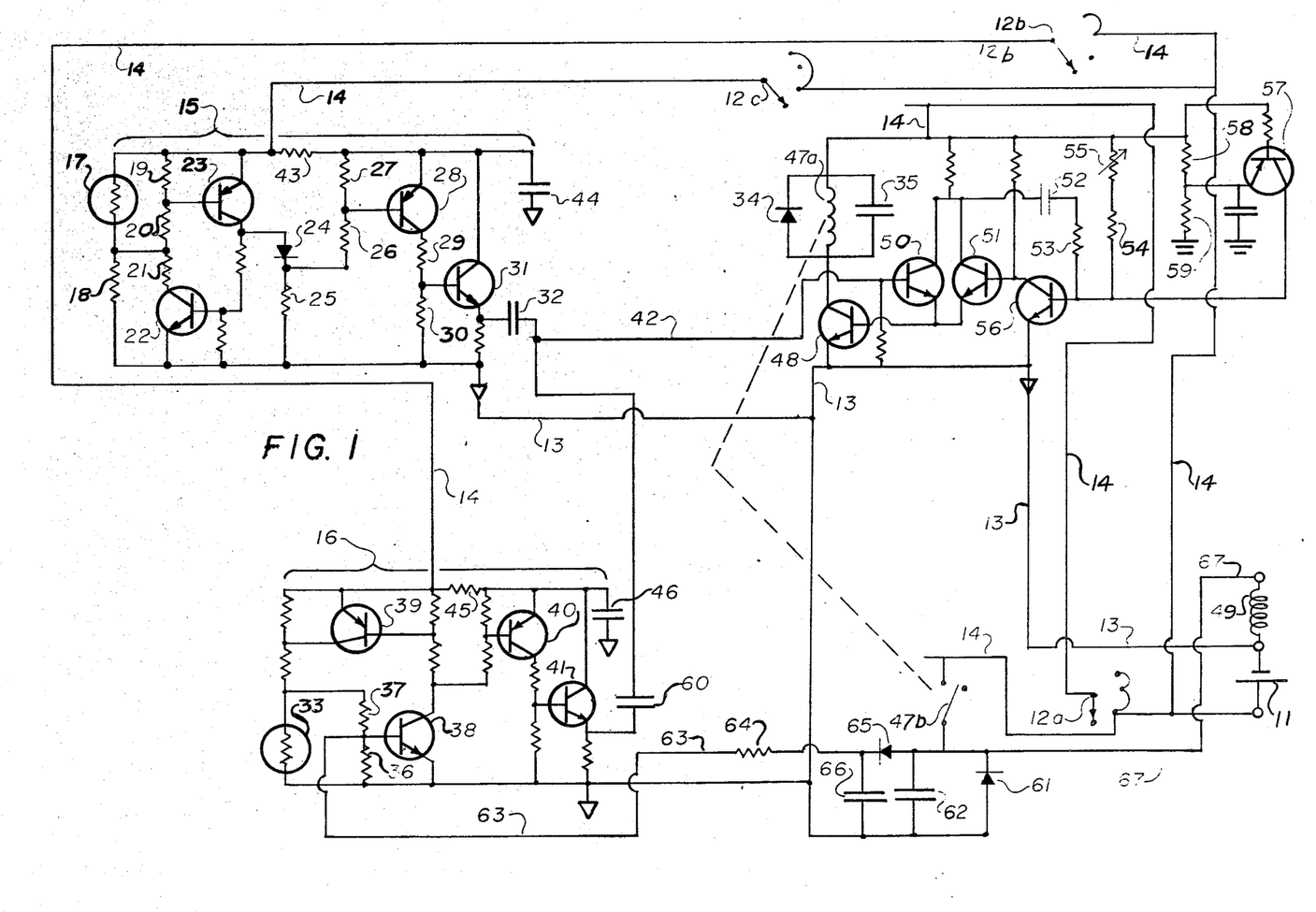
FIG. 1 is a circuit diagram of a preferred embodiment of my photoelectrically actuated timer which is adapted to operate at sunrise, sunset or both.

Referring to the specific embodiment of the invention selected for illustration in the accompanying drawings, the number 11 is used to designate an electric power supply which may be a battery or any other conventional electronic power supply that may conveniently provide the required electric potential required to operate the circuit and associated apparatus with the negative side of power supply 11 connected to negative power lead 13 and to the conventional ground and chassis symbols. The positive terminal of power supply 11 connects through switches 12a, 12b and 12c to positive potential leads 14—14 to distribute potential throughout the circuit. Ganged switch controls 12a, 12b, and 12c provide conventional master off-on switching means together with selective means of supplying or removing energizing power from selected parts of the circuit such as providing electric power to the dawn trigger circuit supplying power to the dust trigger circuit or vice versa, or supplying power for activation of both the dawn and dusk trigger circuits by means of conventional manual switch apparatus.

The blocked circuitry in the upper left hand corner of FIG. 1 may be collectively designated as a dawn sensing and trigger generating circuit 15. A somewhat similar block of circuitry in the lower left hand corner may be designated as a dusk sensing and trigger generating circuit 16. Said dawn sensing and trigger generating circuit 15 is employed to produce a positive pulse or trigger each time that a drastic change from darkness to light is presented to dawn photoelectric sensor cell 17. In the prototype of the preferred version of this invention the inventor has employed a photoelectric sensor cell of the variable resistance type which has very low, conductivity or very high internal resistance during conditions of darkness which converts, however, to a very low resistance electrically conductive condition when said photoelectric sensor cell 17 is exposed to daylight. Photoelectric cell 17 is wired in series with resistor 18, and photoelectric cell 17 and resistor 18 are in turn wired in parallel with a voltage divider network composed of resistors 19, 20 and 21. When the apparatus is in darkness at night photoelectric cell 17 has a very high internal resistance with the result that very little current is drawn through said photoelectric cell which resuls in all of the current flow flowing through resistor 18 being diverted through resistors 19 and 20 resulting in forward biasing with modest current flow through trigger generating transistors 22 and 23 with the output from the base terminal of transistor 22 fed to the collector terminal of transistor 23, and this is the normal resting condition of said direct coupled two transistor trigger generating circuit 22 and 23 and the drain of this current flow pulls the voltage at the collector terminal of transistor 22 down to a low value during darkness. As dawn approaches, the internal resistance of photoelectric cell 17 decreases diverting part of the current flow from resistor 18 through the lowered internal resistance of photo cell 17 which reduces the forward biasing voltage applied to both switching transistor 22 and transistor 23. Since the output of transistors 22 and 23 are interconnected the reduced conductivity of one transistor is amplified and transmitted to the second switching transistor with a rapid and cumulative step function reduction in the conductivity of both transistors until both transistor 22 and transistor 23 are turned off with a resultant rapid rise in the voltage felt at the collector terminal of transistor 22. This very rapid and cumulative reduction of current flow through the switching transistors 22 and 23 of the trigger generating circuit produces a sharp and drastic step reduction in voltage at the collector terminal of transistor 23 so that the onset of dawn in effect produces a sharp negative going pulse at the output taken from the collector terminal of transistor 23.

A diode 24 and resistor 25 network are connected at the collector terminal of the first switching transistor 23 of said dawn trigger generating circuit and arranged to accept only a negative going pulse as said first switching transistor of the pulse generating circuit is switched to its alternate turned off position but said diode 24 rejects the positive going pulse output when said first switching transistor 23 subsequently reverts to its normal resting position when the sun sets that evening and conditions in the trigger generator return to normal as high resistance developes across dawn photoelctric cell 17 with the onset of darkness. Said negative going output pulse from the triggered generating circuit composed of switching transistors 22 and 23 is taken from the junction of diode 24 and resistor 25 and is fed into the base terminal of a cascaded direct coupled two transistor driver amplifier stage of conventional character composed of transistors 28 and 31. The output signal of this dawn sensing and trigger generating and amplifying circuit is taken from the emitter terminal of transistor 31 through coupling capacitor 32 and is employed to activate the timer control circuit illustrated in the block circuitry at the upper right hand corner of FIG. 1.

The separate dusk sensing and trigger generating circuit 16 is illustrated in the block circuitry at the lower left hand corner of FIG. 1 of the drawings herein and is only a revised version of the dawn sensing circuit previously described adjusted to produce an output pulse when daylight fades and the internal resistance of dusk photoelectric cell 33 increases. During the daytime, the dush photo cell 33 has a low internal resistance with the result that the diverted current flow through both divider networks composed of resistors 36 and 37 apply reverse bias to the base of switching transistor 38 which also reverse biases transistor 39 such that both transistors are turned off during the daytime. As dusk approaches daylight fades and the internal resistance of dusk sensing photoelectric cell 33 increases, producing a forward biasing arrangement on switching transistor 38 of the dusk trigger generating circuit so that switching transistors 38 is turned on. This in turn increases the bias to switching transistor 39 turning it on in the same rapid cumulative step function switching action described for the dawn trigger generating circuit previously. In the dusk trigger generating circuit, however, the trigger output signal pulse is taken from the collector terminal of transistor 38 and coupled to the base of driver amplifier transistor 40 which is in turn coupled directly into the base input of secnd driver amplifier transistor 41 amplifying the dusk trigger pulse in the same manner as described for the dawn trigger amplifier circuit. The output from driver amplifier transistor 41 is taken from the emitter terminal of said transistor by means of coupling capacitor 60 and the output of both the dusk and dawn sensing and trigger generating circuits which are connected in parallel are transmitted by means of input lead 42 into the base input terminal of a timing transistor circuit yet to be described. Resistor 45 and capacitor 46 to ground in the dusk driver circuit perform the function of adding a long R-C time constant to the output supply voltage such that interfering spikes on the Vcc voltage to the transistors do not get coupled into the timing circuit.

Resistor 43 and capacitor 44 perform a similar function in the dawn trigger generating circuit.

The timer electrical control circuitry is illustrated in the block circuitry group in the upper right hand corner of FIG. 1 of the drawings. Said timer electrical control circuit is started into its cycle of operation by either a pulse from the dawn trigger circuit 15 or from the dusk trigger circuit having a control relay mechanism 47a and 47b which is provided with an actuating solenoid winding indicated at 47a. The actuating winding of control relay 47 is wired in series with the collector terminal of a relay driver transistor 48. During normal resting or nonactive periods, relay driver transistor 48 is normally switched off so that no current flows through the actuating coil winding of control relay 47a with the result that control relay switch 47b is normally open and no power is applied to load circuit 49 which may be any useful electronic or electromechanical device which needs to be turned on and off for a controlled period of time at specific times related to the presence or absence of light. It will be readily apparent that conversely when relay driver transistor 48 is switched on and current does flow through transistor 48 that current will also flow through actuating coil 47a of the control relay closing switch 47b and applying power to said load circuit 49.

Signalwise, the input to said timer electrical control circuit is through a pair of first and second timing transistors 50 and 51 which are wired back to back with both of their emitter connections wired in parallel to each other and in series to the base connection of said relay driver transistor 48. The associated voltage divider network along with the turned on transistor 46 are so proportioned as to apply sufficient reverse biasing to both timing transistors 50 and 51 and relay driver transistor 38 as to maintain all three of said transistors in turned off position in their resting or no signal period of operation. The previously described trigger input lead from the output of dawn trigger generating circuit 15 and/or dusk trigger generating circuits 16 is fed into the base input to first timing transistor 50 which causes said first timing transistor 50 to go into conduction carrying with it relay driver transistor 48 and the second timing transistor 51 which permits all three of said transistors to become conductive or turned on and the resulting current flow through relay driver transistor 48 also actuates control relay 47 to apply power to load circuit 49 as previously described. From the collector output terminal of timing transistors 50 and 51 there is connected an R-C time constant network composed of timing capacitor 52 and time constant resistors 53, 54, and 55, with resistor 55 being a variable rheostat to provide means for lengthening or shortening of said R-C time constant. Timing capacitor 52 has at some previous time been charged up to a voltage substantially close to the applied Vcc voltage from positive power lead 14. Once timing transistors 50 and 51 have been triggered into conduction, as previously described, timing capacitor 52 will be compelled to discharge and timing transistors 50 and 51 will be held in conductivity during the predetermined time required for said timing capacitor 52 to discharge.

In the absence of an overriding input signal trigger pulse applied to first timing transistor 50 the timing transistor 51 is reverse biased and is held in turned off condition by the application of a bias voltage from the collector terminal of a holding transistor 56 which produces such holding bias voltage as long as said holding transistor is conductive or turned on. Holding transistor 56 is held in its conductive or turned on position as a result of the forward bias voltage normally developed across resistors 54 and 55 during the normal resting or quiescent periods when timing capacitor 52 is not being driven into discharge. As previously stated, timing capacitor 52 is compelled to discharge when a dusk or dawn input trigger pulse is applied to the input base of first timing transistor 40 but as soon as timing capacitor 42 has discharged down to the forward bias voltage point for holding transistor 56, said transistor 56 immediately reverts into a state of conductivity producing an output bias voltage that is coupled back as previously described to the base input of second timing transistor 51 to insure prompt and complete turn off of timing transistors 50 and 51 and turn off of associated relay driver transistor 48 which in turn removes the power applied to load circuit 49.

In order to absorb and suppress current surge spikes that may be generated by actuating solenoid 47a of control relay 47, said relay 47 is bypassed by a surge suppressing diode 34 and surge suppressing capacitor 35 which operate in a conventional manner.

Similarly, when controlled relay switch contact 47b is opened and closed, arcing and surge problems are created that need to be damped out before they get into the trigger generating circuits and cause unwanted triggering of the system. Therefore, between ground and the positive lead 67 supplying positive power to electromechanical load device 49 there is provided a conventional arc suppression circuit composed of Diode 61 and capacitor 62 which absorb and filter out any arcing pulses or surges that may occur when relay controlled switch 47b is opened or closed.

In the present case, the inventor has manufactured during the last several months a number of prototype models of said electronic timer and control device to operate an electric motor load circuit 49 for controlled periods of time at dawn and at dusk to spread corn or similar grain feed from a hopper reservoir in a circular pattern for turkeys and chickens in remote and isolated areas. Under such circumstances where the timer is used in connection with load apparatus that is located at an isolated or remote point from commercial or reliable power facilities such that power supply must be derived from a battery or storage cell that is susceptible to diminution of its available output voltage as the battery ages, there comes a time when power supply battery 11 will deliver reasonably normal voltage during inoperative resting periods, but during operation the voltage from said battery power supply 11 will drop as current is drawn by load 49. Instability and unreliability are always problems of battery depletion but in this case there is a marginal area where a reduction in Vcc under load results in reseting the dusk trigger circuit so that the system is ready to fire again. When the load turns off, the battery voltage reverts to normal and with proper voltage applied to the low drain transistor circuitry the system triggers itself into repeat operation. This process can repeat and repeat until the grain supply and/or the battery voltage source 11 are exhausted. In some instances this repetitive recycling of the system can repeat so frequently that the control relay 47 appears to chatter with considerable sparking damage to the relay switch 47b. In order to prevent this repetitive self-recycling of the timing equipment and to prevent relay chatter damage, the inventor has provided two kinds of low voltage protection circuits. In the first protective system the inventor prevents relay chatter from low voltage by providing a circuit to monitor the available Vcc level and to block or disable the timer system when the Vcc voltage falls below a selected level. In the second low voltage protection system the inventor has used a sampling of the switched side of the load power supply voltage to feed back to a point in the dusk trigger generating circuit to add bias to the trigger transistors in the dusk trigger generating circuit in such manner as to make it impossible for said circuit to reset itself while power is being supplied to the load device.

In the first of these low voltage protection and relay chatter prevention circuits, the inventor has provided a circuit in which a low voltage protection transistor 57 provides for an automatic turn off of the timing circuit when the Vcc voltage drops below a selected level. This is done by means of an emitter bias voltage produced by resistors 58 and 59 which form a voltage divided network which turn low voltage protection transistor 57 on when the Vcc voltage drops below the specified level built into the voltage divider network. When low voltage protection transistor 57 is forward biased into its turned on condition the output from the collector terminal of transistor 57 is coupled back into the base input terminal of holding transistor 56 and said holding transistor 56 is consequently overwhelmingly forward biased in an on position. As we have previously seen, when holding transistor 56 is conducting, the timing circuit and the relay driver transistor are all turned off. Thus the circuit automatically disables itself when the battery supply voltage has fallen to a point where satisfactory operation of the circuitry and associated apparatus cannot be secured.

In the second low voltage protection system the inventor has sought to minimize the consequence of a sudden drop in Vcc supply voltage to the dusk trigger generating circuit. When relay switch 47b closes to apply power to load 49, a sampling of the voltage applied through switched line 67 to load 49 is also fed back through feedback line 63 which connects through resistor 64 and surge suppressing diode 65 and capacitor 66 to the base terminal of switching transistor 38. This results in blocking or preventing the dusk trigger circuit, including transistor 16, from resetting, which also prevents the dusk trigger generating circuit 16 from producing a new trigger pulse as long as power is applied to load 39.

A number of arguments can be made for substituting a conventional Schmitt trigger circuit for the trigger generating portions of dawn sensing and trigger generating circuit 15 and dusk sensing and trigger generating circuit 16. The Schmitt trigger circuit does have advantages of sharp decisive switching action with high signal output that requires minimum amplification of the generated trigger signal. However, the inventor herein has preferred the trigger generators illustrated in circuits 15 and 16 because they can operated in standby readiness state over long periods of time with minimum drain on a battery power supply. This is a primary consideration where the equipment must be battery operated at remote and isolated locations over an extended period of time. Nevertheless, when an abundant power source is conveniently available at the site of operation there would be advantages in employing such a Schmitt trigger generator circuit and the inventor hastens to assert that the substitution of such a Schmitt trigger generator falls within the spirit and scope of the invention claimed herein and the inventor will provide an alternate embodiment of the invention incorporating such a Schmitt trigger circuit.

At the present time there is almost a fad compulsion to design all new circuits employing "all solid state" components with a preference for substitution of power switching transistors for relay controlled switches wherever possible. Substituting transistor switching for relay switching is particularly appropriate where exposed operating conditions or climatic conditions cause rapid pitting and corrosion of relay contact points. The inventor has preferred to use a relay in the prototype models built so far but recognizes the appropriateness of replacing relay power switch 47 with an appropriate power switching transistor and asserts that the substitution of such a heavyduty power switching transistor is within the scope of the invention claimed within.

Figure 2:
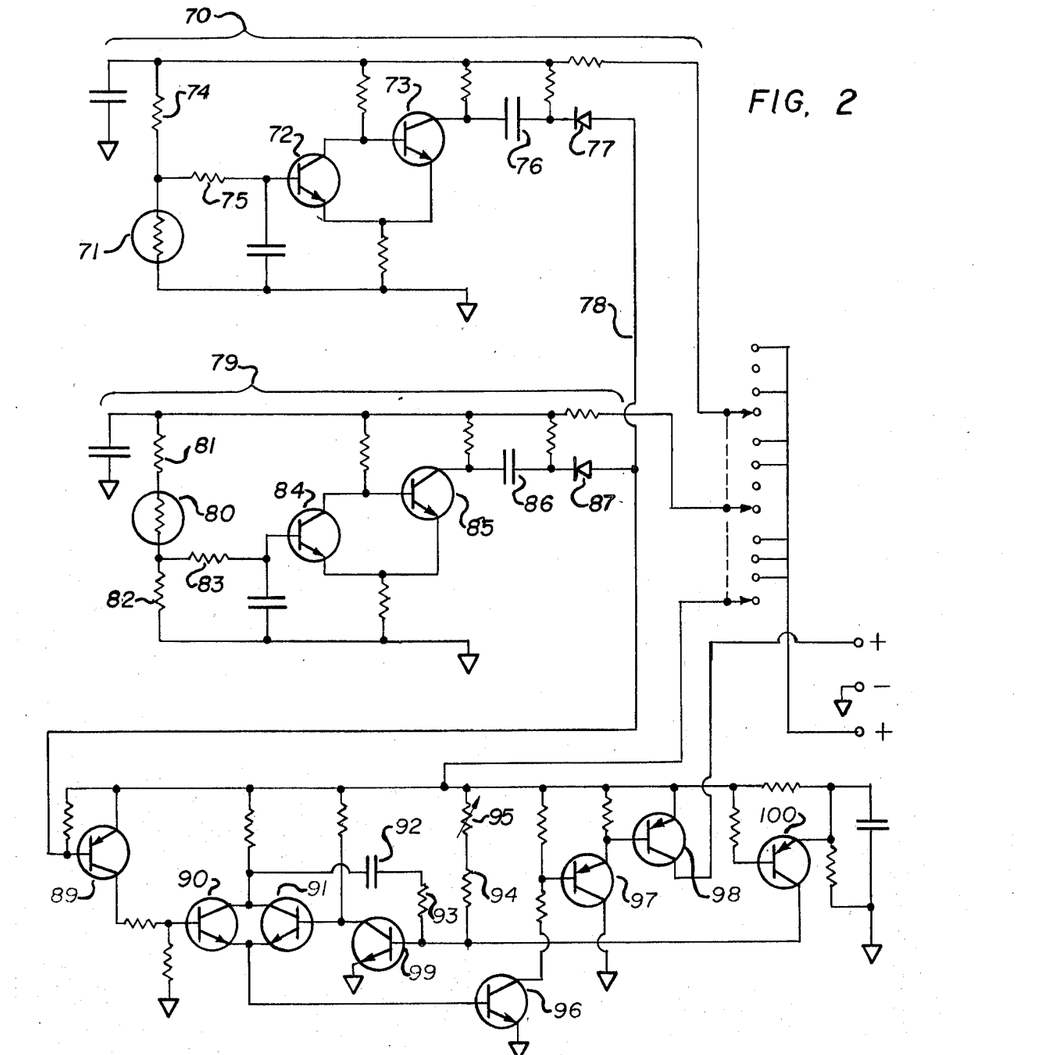
FIG. 2 is a circuit diagram of an alternate all "solid state" embodiment of my photoelectric timer in which a so called high output Schmitt trigger circuit is used to produce the dawn and dusk triggers and in which the electromechanical relay has been replaced by a heavy duty switching transistor.

In order to illustrate appropriate means of substituting both Schmitt rigger generators and a power switching transistor circuit in this invention the inventor has submitted for consideration in FIG. 2 of the drawings herein an alternate version of his invention employing all solid state construction. In said alternate embodiment of the invention, dawn sensing and trigger generation circuit 70 is composed of a dawn sensing photo electric cell 71 together with switching transistors 72 and 73 arranged in a conventional Schmitt trigger configuration. During the nighttime resting period switching transistor 72 is forward biased into a conductive or switched on state by a voltage divider network composed of the high internal resistance of photoelectric cell 71 and fixed resistors 74 and 75 while alternate switching transistor 73 is reverse biased to cut off. At dawn, increasing light causes the internal resistance of dawn sensing photoelectric cell 71 to decrease reversing the bias voltage supplied to transistor 72 which results in switching said transistor 72 from on to off condition. This in turn causes alternate switching transistor 73 to flip into its on or conductive position, producing a large output trigger signal through coupling capacitor 76 and diode 77 via transfer lead 78 to the base of input amplifier transistor 89 of the electronic timer circuit.

Dusk trigger generating circuit 79 operates in the same manner as the dawn trigger generating circuit except that dusk sensing photoelectric cell 89 has been moved in the circuit to respond to the onset of evening darkness in such manner as to reverse the biasing to switching transistor 84 causing it to switch from on to off condition. This in turn causes switching transistor 85 to change from its resting turned off state to its alternate turned on state again, producing a large amplitude output trigger signal through coupling capacitor 86 and diode 87 via transfer lead 78 to the base of input amplifier transistor 89 in the electronic timer circuit.

At dusk, reversing light conditions with an increase in the internal resistance of dawn sensing photoelectric cell 71 causes switching transistors 72 and 73 to reset themselves to their original resting positions so that the circuit is again ready to produce another output pulse when dawn breaks the following morning. Switching transistors 84 and 85 in dusk sensing and trigger generating circuit 79 are reset at dawn so that they will be ready to fire again the following evening.

Only minor revisions have been made in the electronic timer portions of the alternate embodiment of the invention as illustrated in the lower block of circuitry in FIG. 2 of the drawings herein. Input transistor 89 amplifies and inverts the pulse received from one or the other of the dawn and dusk trigger generating circuits and applies this trigger to the base input to the first timing transistor 90. Timing transistors 90 and 91, together with R-C time constant components 92, 93, 94 and 95, operate in exactly the same manner as described for the equivalent timer components in the previous embodiment of the invention described in FIG. 1 of the drawings.

Where switch control transistor 96 was used to open and close relay 47 in the previous embodiment of the invention, said switch control transistor 96 has been converted in this alternate embodiment to provide switched on or switched off forward bias to a two stage power switching circuit composed of power switching transistors 97 and 98 which control the application of electric power to the output load circuit or device in the same manner as relay 47 did in the first embodiment of the invention.

Holding transistor 99 performs the same functions as holding transistor 56 in the first embodiment of the invention and except for slight alteration of the means of securing the operating bias supply, the low voltage protection transistor 100 performs its protective function in the same manner as explained for the equivalent transistor 57 in the first embodiment of the invention.

OPERATION

Figure 3:
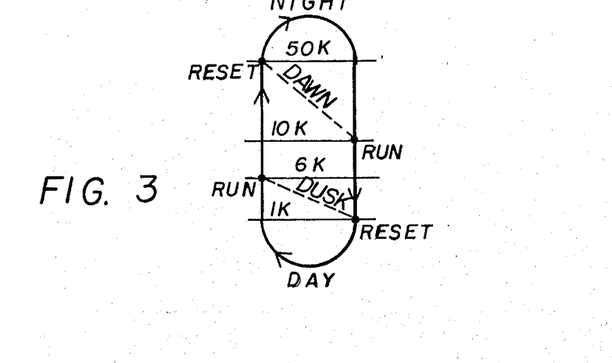
FIG. 3 is a time cycle chart tracing the successive steps of operation of the control timer circuit over the course of a twenty-four hour period.

The cycle of operation is depicted graphically by the diagram of FIG. 3. The vertical scale is resistance of the photocells with the high resistance levels of darkness at the top and light at the bottom, with the transition levels distributed in between. The oval describes the cyclic path for both dawn and dush circuits incorporating like photocells. In the case of the dawn circuit, the trigger point RUN is seen to start typically at 10K ohms. Because of the hysteresis built into the circuit, a reversal back to 50K ohms is required to reset that circuit before it can run again. Because of the selection of the "RUN" light level in the definite night-to-day transition, accidental premature resetting is improbable until the following evening when the greater darkness is assured. This hysteresis therefore insures that the dawn circuit cannot run more than once per day.

The dusk trigger circuit operates in a similar manner between its trigger and reset points of 6K and 1K ohms respectively. Specifically, when the dusk photocell resistance increases to 6K ohms in the day-to-night transition, the trigger pulse is generated to cause the dusk run cycle. For the dusk circuit to reset, the light conditions would have to reverse the darkening trend to the increased light conditions that produce 1K ohms. Once again, by selection of the run trigger points in the definite day-to-night light levels, resetting of the dusk trigger circuit is delayed until the following morning when the change to day is definite. This hysteresis again insures that the circuit will produce only a single run during each light cycle, or day. Each of said triggering circuits trace this cycle of firing once in each twenty-four hour period and resetting twelve hours later as light conditions reverse.

When a trigger pulse from one of the dawn or dusk sensing and triggering circuits is fed into the timer, timing transistors 50 and 51 are turned on and will be held on for a period of time determined by the R-C time constant of timing capacitor 52, as adjusted by fine timing control 55. As long as timing transistors 50 and 51 are turned on, switch control transistor 48 is also turned on to close control relay 47 and supply electric power to load device 49 as previously explained.

ADVANTAGES

A primary advantage of the improved photoelectrically triggered timing circuit for controlling electrically responsive load apparatus in response to alternating light changes such as dawn and dusk proposed by this invention is that it carefully separates the light sensing, trigger generation, timing and control functions in such manner as to permit more precise and more effective adjustment and operation of each said function.

Another advantage of the invention is that it provides apparatus as described above which may be set to operate at sunrise, or sunset, or both.

A further advantage of the invention is that it provides apparatus as described above in which the length of time current is supplied to the load may be varied.

Still another advantage of the invention is that by effectively designing the equipment for very low current drain and by providing built in safeguards against drops in the power supply voltage, the equipment has been made suitable for supplying control functions at remote and isolated sites where commercial power is not readily available and that are too remote or isolated for daily servicing.

Although this specification describes only two embodiments of the invention with certain applications thereof, it should be understood that structural or material rearrangements of adequate or equivalent parts, substitutions of equivalent functional elements and other modifications in structure can be made and other applications devised without departing from the spirit and scope of my invention. I therefore desire that the description and drawings herein be regarded as only an illustration of my invention and that the invention be regarded as limited only as set forth in the following claims, or as required by the prior art.

Having thus described my invention, I claim:

1. An improved photoelectrically triggered timing circuit for controlling electrically responsive load apparatus in response to alternate light changes, said circuit comprising:
  A. a dawn sensing and trigger generating circuit to produce an output pulse when nightime darkness changes to daylight, said dawn sensing and trigger generating circuit having
    1. a dawn photoelectric sensor cell having high internal electrical resistance during conditions of darkness and converting to an electrically conductive condition when exposed to daylight,
    2. a transistor trigger pulse generating circuit designed to produce an output pulse when increasing light at dawn causes a reduction in the internal resistance of the photoelectric sensor cell,
    3. transistor means of amplifying said trigger pulse;
  B. a separate dusk sensing and trigger generating circuit to produce an output pulse when day time light changes to darkness said dusk sensing and trigger generating circuit having
    1. a dusk photoelectric sensor cell having high internal electric resistance during conditions of darkness and converting to an electrically conductive condition when exposed to daylight,
    2. a transistor trigger pulse generating circuit designed to produce an output pulse when decreasing light at dusk causes an increase in the internal resistance of the dusk sensing photoelectric cell,
    3. transistor means of amplifying said trigger pulse;
  C. a control relay mechanism with an actuating solenoid winding and switch means to apply or interrupt the application of electric power to an electromechanical load device;
  D. a normally turned off relay driver transistor circuit designed to control the flow of electric current to the actuating winding of said control relay mechanism when driven into its conductive turned on state with means for driving said relay driver transistor circuit into conduction;
  E. a transistorized R-C timer circuit having
    1. input means to said timer circuit from the dawn trigger generating circuit and from the dusk trigger generating circuit so that the timer can be triggered into conductive turned on condition by an input trigger from either of these trigger generator sources,
    2. an adjustable R-C time constant circuit adapted to hold the timing transistors in conduction through a controlled period of time,
    3. output signal means from the adjustable timer circuit coupled back to the base input of the relay driver transistor circuit to control the conductivity of said relay driver circuit;
  F. connective means for supplying controlled power to an electromechanical load device; and
  G. a power supply source to supply operative power to the electromechanical load device and to supply Vcc power for the transistorized circuitry.

2. The improved photoelectrically triggered timing circuit for controlling electrically responsive load apparatus in response to alternate light changes as described in claim 1 with the addition of a holding transistor circuit provided with input control bias voltage from an intermediate point in the R-C time constant circuit and supplying an auxiliary control bias to one of the transistors in the timing circuit in such manner as to hold the timing transistor in the turned on conductive state while the R-C timing capacitor is being discharged.

3. The photoelectrically triggered timing circuit described in claim 1 with the additional provision of means of preventing improper recycling of the dusk trigger circuit from loading drops in the power supply voltage by providing a feed back voltage from the ungrounded side of the load circuit to the base terminal of the first switching transistor in the trigger generator portion of the dusk trigger generator circuit to block resetting of the dusk trigger generator circuit as long as electric power is applied to the load circuit.

4. The photoelectrically triggered timing circuit described in claim 2 with a low voltage relay chatter prevention circuit added to the timer circuitry in which
  A. a low voltage protection transistor is paralleled with
    1. its base terminal connected through a resistor to the Vcc voltage supply lead for the timer circuitry,
    2. emitter bias for said low voltage protection transistor is taken from a voltage divider network connected between said Vcc voltage supply lead and ground and of such adjusted value as to maintain the low voltage protection transistor in turned off mode so long as the applied Vcc voltage is above a selected normal value but which will allow said low voltage protection transistor to switch to its conductive or on mode when the Vcc voltage and the base bias voltage fall below the selected minimum value, and B. a bias voltage taken from the collector terminal of said low voltage protection transistor is coupled back into the base terminal of the holding transistor in the timer control circuit in such manner as to drive said holding transistor into conduction which in turn blocks the timer and relay driver transistor disabling all of the timer, the relay controls and the controlled load apparatus as long as the power supply voltage remains below the selected minimum voltage.

5. The improved photoelectrically triggered timing circuit for controlling electrically responsive load apparatus in response to alternate light changes as described in claim 1 with the trigger generator circuits employed in the dawn sensing and trigger generator circuit and the dusk sensing and trigger generating circuit replaced by a Schmitt trigger generator circuit.

6. The improved photoelectrically triggered timing circuit for controlling electrically responsive load apparatus in response to alternate light changes as described in claim 1 with the control relay mechanism replaced by a switching power transistor with appropriate biasing and control arrangements to apply and to interrupt the application of electrical power to controlled electromechanical load apparatus.

7. An improved photoelectrically triggered timing circuit for controlling electrically responsive load apparatus in response to alternate light changes, said circuit comprising:

A. a dawn sensing and trigger generating circuit to produce an output pulse when night time darkness changes to daylight, said dawn sensing and trigger generating circuit having
  1. a photoelectric sensor cell having high internal electrical resistance during conditions of darkness and converting to an electrically conductive condition when exposed to daylight,
  2. a trigger pulse generating circuit composed of a pair of coupled transistors in which
    a. a first sensing and switching transistor is biased to conduct by the high resistance of the dawn sensing photoelectric cell during its darkness resting period,
    b. a second switching transistor biased to a normally conducting state and directly connected to the output of the first switching transistor are arranged to produce a negative going output pulse when the presence of light striking the dawn photoelectric cell causes said first and second transistors to flop from their resting on state to their alternative off state.
  3. a diode and resistor network connected to the output at the collector terminal of the first switching transistor arranged to accept a negative going pulse as said first transistor is switched to its alternate off position but to reject the positive pulse output when said second switching transistor reverts to its normal resting position,
  4. a cascaded direct coupled two transistor driver amplifier stage coupled to the diode output from the pulse generating circuit,
  5. the amplified output pulse is taken from the emitter terminal of the driver amplifier circuits by means of capacitor coupling;

B. a dusk sensing and trigger generating circuit to produce an output pulse when daylight begins to change to darkness, said dusk sensing and trigger generating circuit having
  1. a photoelectric sensor cell having high internal electrical resistance during conditions of darkness and converting to an electrically conductive condition when exposed to daylight,
  2. a trigger pulse generating circuit composed of a pair of coupled transistors in which
    a. a first sensing and switching transistor is biased to cut-off by the low resistance of the dusk sensing photoelectric cell during its daylight resting period, and
    b. a second switching transistor biased to a normally non-conducting state and directly connected to the output of the first switching transistor are arranged to produce an output pulse when the absence of light striking dusk photoelectric cell causes said first and second transistors to flop from their off state to their alternative on state,
  3. a cascaded direct coupled two transistor driver amplifier stage connected to the output from the pulse generating circuit,
  4. the amplified output pulse is taken from the emitter terminal of the driver amplifier circuits by means of capacitor coupling;

C. a timer electrical conrol circuit that is started into its cycle of operation by either a pulse from the dawn trigger circuit or a pulse from the dusk trigger circuit, said timer control circuit having
  1. a control relay mechanism with an actuating solenoid winding,
  2. a normally switched off relay driver transistor with its collector circuit wired in series through the actuating coil winding of the control relay so that said relay is caused to close and delier power to associated electro-mechanical equipment when current is allowed to flow through the relay driver transistor,
  3. a pair of first and second timing transistors are wired back to back with both of their emitter connections wired in series through the base connections of said relay driver transistor so that in their normal state the relay driver and the two timer transistors are turned off,
  4. an input lead from the paralleled outputs from the dawn trigger generating circuit and the dusk trigger generating circuit feed the output pulse from one of said trigger generating and amplifier circuits to the input base terminal of the first timing transistor which turns on conduction in both timing transistors and causes conduction through the relay driver transistor which in turn causes said control relay to be closed supplying power to the controlled associated equipment.
  5. the base of the second timing transistor is connected to its bias supply voltage in such manner as to hold both timing transistors and the relay driver transistor in turned off state during normal resting conditions,
  6. a variable R-C time constant network is connected from the collector terminals of the timing transistors to the base terminal of the holding transistor and thence to the supply voltage so that the timing transistors are held in a state of turned-on conduction during the predetermined time period required for the timing capacitor to discharge, and after the discharge of the R-C time constant circuit the timing transistors revert to their resting switched-off state;

D. connective means for supplying controlled power to an electromechanical load device;

E. a power supply source to supply operative power to the electromechanical load device and to supply Vcc power for the transistorized circuitry;

F. a master control manual switching arrangement including provisions for
 1. off-on power controls,
 2. selective means for supplying power to the dawn trigger generating circuit without activating the dusk trigger generating circuit,
 3. selective means for supplying power to the dusk trigger generating circuit without activating the dawn generating circuit,
 4. means for supplying electric activating power to both the dawn and dusk trigger generating circuits.

8. The improved photoelectrically triggered timing circuit for controlling electrically responsive load apparatus in response to alternate light changes as described in claim 7 with the addition of a holding transistor circuit provided with input control bias voltage from an intermediate point in the R-C time constant circuit and supplying an auxiliary control bias to one of the transistors in the timing circuit in such manner as to hold the timing transistor in the turned on conductive state while the R-C timing capacitor is being discharged.

9. The photoelectrically triggered timing circuit described in claim 7 with the additional provision of means of preventing improper recycling of the dusk trigger circuit from loading drops in the power supply voltage by providing a feed back voltage from the ungrounded side of the load circuit to the base terminal of the first switching transistor in the trigger generator portion of the dusk trigger generator circuit to block resetting of the dusk trigger generator circuit as long as electric power is applied to the load circuit.

10. The photoelectrically triggered timing circuit described in claim 8 with a low voltage relay chatter prevention circuit added to the timer circuitry in which A. a low voltage protection transistor is connected between the Vcc source voltage and the holding transistor with
 1. its base terminal connected through a resistor to the Vcc voltage supply lead for the timer circuitry,
 2. emitter bias for said low voltage protection transistor is taken from a voltage divider network connected between said Vcc voltage supply lead and ground and of such adjusted value as to maintain the low voltage protection transistor in turned off mode so long as the applied Vcc voltage is above a selected normal value but which will allow said low voltage protection transistor to switch to its conductive or on mode when the Vcc voltage and the base bias voltage fall below a selected minimum value, and B. a bias voltage taken from the collector terminal of said low voltage protection transistor is coupled back into the base terminal of the holding transistor in the timer control circuit in such manner as to drive said holding transistor into conduction which in turn blocks the timer and relay driver transistor disabling all of the timer, the relay controls and the controlled load apparatus as long as the power supply voltage remains below the selected minimum voltage.

11. The improved photoelectrically triggered timing circuit for controlling electrically responsive load apparatus in response to alternate light changes as described in claim 7 with the trigger generator circuits employed in the dawn sensing and trigger generator circuit and the dusk sensing and trigger generating circuit replaced by a Schmitt trigger generator circuit.

12. The improved photoelectrically triggered timing circuit for controlling electrically responsive load apparatus in response to alternate light changes as described in claim 7 with the control relay mechanism replaced by a switching power transistor with appropriate biasing and control arrangements to apply and to interrupt the application of electrical power to controlled electromechanical load apparatus.

13. A simplified and improved all solid state photoelectrically triggered timing circuit for controlling electrically responsive load apparatus in response to alternate light changes, said circuit comprising:

A. a dawn sensing and trigger generating circuit to produce an output pulse when night time darkness changes to daylight, said dawn sensing and trigger generating circuit having
 1. a dawn photoelectric sensor cell having high internal electrical resistance during conditions of darkness and converting to an electrically conductive condition when exposed to daylight,
 2. a trigger pulse generating circuit composed of a pair of coupled switching transistors arranged in a Schmitt trigger configuration in which
  a. a first sensing and switching transistor, during its night time resting period, is forward biased into conduction by an appropriate resistor voltage divider network and the high internal resistance of the dawn sensing photoelectric cell,
  b. with the second switching transistor being reversed biased to cut off during its resting state at night so that when increasing light conditions at sunrise lower the internal resistance of the dawn sensing photoelectric cell the first Schmitt trigger transistor is biased to cutoff driving the second Schmitt trigger transistor into conduction to produce a sharp output pulse at the moment of switching, and
  c. the negative going output pulse is taken from the collector terminal of the second Schmitt trigger generator switching transistor through a capacitor-diode network arranged to accept the negative going pulse when the switching circuit fires but rejects the positive going pulse when the trigger generating circuit resets that evening;

B. a dusk sensing and trigger generating circuit to produce an output pulse when daylight changes to darkness, said dusk sensing and trigger generating circuit having
 1. a dusk photoelectric sensor cell having low internal electrical resistance during conditions of daylight and converting to an electrically low conductive condition when exposed to darkness with the onset of evening,
 2. a trigger pulse generating circuit composed of a pair of coupled switching transistors arranged in a Schmitt trigger configuration in which a. a first sensing and switching transistor, which during its day time resting period is forward biased into conduction by an appropriate resistor voltage divider network with the low internal resistance of the dusk sensing photoelectric cell, b. with the second switching transistor being reversed biased to cut off during its resting state during the day time so that when decreasing light conditions at sunset raise the internal resistance of the dusk sensing photoelectric cell the first Schmitt trigger transistor is biased to cutoff driving the second Schmitt trigger transistor into conduction to produce a sharp output pulse at the moment of switching, and c. the negative going output pulse is taken from the collector terminal of the second Schmitt trigger generator switching transistor through a capacitor-diode network arranged to accept the negative going pulse when the switching circuit fires but rejects the positive going pulse when the trigger generating circuit resets that evening;

C. an electronic timer control circuit having
1. an input amplifying and phase inverting transistor circuit arranged to connect to and trigger a timing circuit,
2. an input lead from the paralleled outputs from the dawn trigger circuit and the dusk trigger circuit feed the output pulse from one of said trigger generating circuits to the input base terminal of the input amplifier — inverter stage,
3. a pair of first and second timing transistors are wired back to back with both of their emitter connections paralleled and then wired in series through the base connection of a load driver transistor so that in their normal state the load driver transistor and the two timer transistors all are turned off while the application of an input pulse from the input amplifier inverter is arranged to trigger both timer transistors into conduction,
4. the base of the second timing transistor is connected to its bias supply voltage in such manner as to hold both timing transistors and the load driver transistor in turned off state during normal resting conditions,
5. a variable R-C time constant network is connected from the collector terminals of the timing transistors to the Vcc supply voltage so that the timing transistors are held in a state of turned-on conduction during the predetermined time period required for the timing capacitor to discharge, and after the discharge of the R-C time constant circuit the timing transistors revert to their resting switched-off state;
6. a load driver switching transistor normally reverse biased to turned off condition responsive to a base input signal from the timer circuit and with its collector output lead arranged to deliver a switching signal to a control power switching circuit;

D. a two stage load control power switching circuit adapted to perform the functions of a load control relay;

E. connective means for supplying controlled power from the collector terminal of the second power switch transistor to an electromechanical load device;

F. a power supply source to supply operative power to the electromechanical load device and to supply Vcc power for the transistorized circuitry;

G. a master control manual switching arrangement including provisions for
1. off-on power controls,
2. selective means for supplying power to the dawn trigger generating circuit without activating the dusk trigger generating circuit,
3. selective means for supplying power to the dusk trigger generating circuit without activating the dawn generating circuit,
4. means for supplying electric activating power to both the dawn and dusk trigger generating circuits.

14. The simplified and improved all solid state photoelectrically triggered timing circuit for controlling electrically responsive load apparatus in response to alternate light changes as described in claim 13 with the addition of a holding transistor circuit provided with input control bias voltage from an intermediate point in the R-C time constant circuit and supplying an auxiliary control bias to one of the transistors in the timing circuit in such manner as to hold the timing transistor in its turned on conductive state while the R-C timing capacitor is being discharged and to insure that said timing transistors are completely turned off between input trigger signals.

15. The photoelectrically triggered timing circuit described in claim 14 with a low voltage protection circuit added to the timer circuitry in which
A. a low voltage protection transistor is connected between the Vcc source voltage and the holding transistor with
1. the base terminal of said low voltage protection transistor connected through a resistor to the Vcc voltage supply lead for the timer circuitry, and
2. emitter bias for said low voltage protection transistor being taken from a voltage divider network connected between said Vcc voltage supply lead and ground and of such adjusted value as to maintain the low voltage protection transistor in turned off mode so long as the applied Vcc voltage is above a selected normal value but which will allow said low voltage protection transistor to switch to its conductive or on mode when the Vcc voltage and the base bias voltage fall below a selected minimum value and
B. a bias voltage taken from the collector terminal of said low voltage protection transistor is coupled back into the base terminal of the holding transistor in the timer control circuit in such manner as to drive said holding transistor into conduction which in turn blocks the timer and relay driver transistor disabling all of the timer, the relay controls and the controlled load apparatus as long as the power supply voltage remains below the selected minimum voltage.

* * * * *